US007791525B2

(12) United States Patent
Rivoir

(10) Patent No.: US 7,791,525 B2
(45) Date of Patent: Sep. 7, 2010

(54) TIME-TO-DIGITAL CONVERSION WITH CALIBRATION PULSE INJECTION

(75) Inventor: Jochen Rivoir, Magstadt (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 3 days.

(21) Appl. No.: 12/224,114

(22) PCT Filed: Mar. 10, 2006

(86) PCT No.: PCT/EP2006/060636

§ 371 (c)(1), (2), (4) Date: Jan. 20, 2009

(87) PCT Pub. No.: WO2007/093221

PCT Pub. Date: Aug. 23, 2007

(65) Prior Publication Data

US 2009/0303091 A1 Dec. 10, 2009

(30) Foreign Application Priority Data

Feb. 17, 2006 (EP) ................................. 06110132

(51) Int. Cl.
*H03M 1/50* (2006.01)

(52) U.S. Cl. ....................................... 341/166; 341/155

(58) Field of Classification Search ................. 341/166, 341/155; 327/263, 271
See application file for complete search history.

(56) References Cited

U.S. PATENT DOCUMENTS 4,118,738 A * 10/1978 Arnstein ..................... 348/497
7,057,978 B2 * 6/2006 Panek ......................... 368/113
7,106,239 B1 * 9/2006 Keskin ........................ 341/157
7,196,778 B2 * 3/2007 Lin et al. .................. 356/5.01

FOREIGN PATENT DOCUMENTS

WO WO 2007/093221 8/2007

OTHER PUBLICATIONS

Kalisz J. et al., "Time-to-Digital Converter with Direct Coding and 100 ps Resolution", Electronics Letters, IEE Stevenage, GB, vol. 31, No. 19, Sep. 14, 1995, pp. 1658-1659.

Dudek, P., et al., "A High-Resolution CMOS Time-To-Digital Converter Utilzing a Vernier Delay Line", IEEE Journal of Solid-State Circuits, IEEE Service Center, Piscataway, NJ, US, pp. 240-246, (Feb. 2000).

* cited by examiner

*Primary Examiner*—Peguy JeanPierre
(74) *Attorney, Agent, or Firm*—Holland & Hart, LLP

(57) ABSTRACT

A time-to-digital converter having at least one chain of delay elements, wherein a status of the chain of delay elements represents a digital signal relating to a time interval to be converted, wherein the time-to-digital converter having an injector for injecting a calibration pulse of known position and/or known duration in time into the chain of delay elements, wherein a first status of the chain of delay elements being expected in response to the calibration pulse, the time-to-digital converter further having a capturer for capturing the actual status of the chain of delay elements in response to the calibration pulse, a calculator for calculating a deviation between the expected first status and the actual status, and a combination unit for taking into account the deviation when converting the time interval to the digital signal.

16 Claims, 7 Drawing Sheets

$$h_n = \sum_{m=1}^{M} (p_m == n), \quad n = 1..N$$

$$\sum_{n=1}^{N} h_n = M$$

$$\boxed{F_k = \frac{1}{M} \sum_{n=1}^{k} h_n, \quad k = 1..N}$$

Fig.4

$$T_1 = t_R (C_1 + F(p_1))$$

$$T_2 = t_R (C_2 + F(p_2))$$

$$T_2 - T_1 = L \cdot T_{CLK}$$

$$\boxed{t_R = \frac{(C_2 - C_1) + (F(p_2) - F(p_1))}{L} T_{CLK}}$$

Fig.5

TIME-TO-DIGITAL CONVERSION WITH CALIBRATION PULSE INJECTION

BACKGROUND OF THE INVENTION

The present invention relates to a time-to-digital converter and a method for time-to-digital conversion.

SUMMARY

According to an embodiment, a time-to-digital converter having at least one chain of delay elements, wherein a status of the chain of delay elements represents a digital signal relating to a time interval to be converted, may have an injector for injecting a calibration pulse of known position and/or known duration in time into the chain of delay elements, a capturer for capturing a first actual status of the chain of delay elements in response to the calibration pulse and a second actual status of the chain of delay elements in response to a signal related to the time interval to be converted, a former for forming a ratio of the first and second actual status, and a correction unit for taking into account the ratio when converting the time interval to the digital signal.

According to another embodiment, a time-to-digital converter having at least one chain of delay elements, wherein a status of the chain of delay elements represents a digital signal relating to a time interval to be converted, may have an injector for injecting a calibration pulse of known position and/or known duration in time into the chain of delay elements, a capturer for capturing an actual status of the chain of delay elements in response to the calibration pulse, a calculator for calculating a deviation between a first status of the chain of delay elements and the actual status, the first status being expected in response to the calibration pulse, and a combination unit for taking into account the deviation when converting the time interval to the digital signal.

According to another embodiment, a method for time-to-digital conversion using a time-to-digital converter having at least one chain of delay elements, wherein a status of the chain of delay elements represents a digital signal relating to a time interval to be converted, may have the steps of injecting a calibration pulse of known position and/or known duration in time into the chain of delay elements, capturing a first actual status of the chain of delay elements in response to the calibration pulse and a second actual status of the chain of delay elements in response to a signal related to the time interval to be converted, forming a ratio of the first and second actual status, and taking into account the ratio when converting the time interval to the digital signal.

According to another embodiment, a method for time-to-digital conversion using a time-to-digital converter having at least one chain of delay elements, wherein a status of the chain of delay elements represents a digital signal relating to a time interval to be converted, may have the steps of injecting a calibration pulse of known position and/or known duration in time into the chain of delay elements, capturing an actual status of the chain of delay elements in response to the calibration pulse, calculating a deviation between a first status of the chain of delay elements and the actual status, the first status being expected in response to the calibration pulse, and taking into account the deviation when converting the time interval to the digital signal.

Another embodiment may be a software program or product, stored on a data carrier, for controlling or executing, when run on a data processing system such as a computer, a method for time-to-digital conversion using a time-to-digital converter having at least one chain of delay elements, wherein a status of the chain of delay elements represents a digital signal relating to a time interval to be converted, wherein the method may have the steps of injecting a calibration pulse of known position and/or known duration in time into the chain of delay elements, capturing a first actual status of the chain of delay elements in response to the calibration pulse and a second actual status of the chain of delay elements in response to a signal related to the time interval to be converted, forming a ratio of the first and second actual status, and taking into account the ratio when converting the time interval to the digital signal.

Another embodiment may be a software program or product, stored on a data carrier, for controlling or executing, when run on a data processing system such as a computer, a method for time-to-digital conversion using a time-to-digital converter having at least one chain of delay elements, wherein a status of the chain of delay elements represents a digital signal relating to a time interval to be converted, wherein the method may have the steps of: injecting a calibration pulse of known position and/or known duration in time into the chain of delay elements, capturing an actual status of the chain of delay elements in response to the calibration pulse, calculating a deviation between a first status of the chain of delay elements and the actual status, the first status being expected in response to the calibration pulse, and taking into account the deviation when converting the time interval to the digital signal.

A calibration pulse is injected into at least one chain of delay elements. The calibration pulse can comprise two reference clock edges, wherein the position in time and/or the duration in time of the calibration pulse is known accurately. In an embodiment a first actual status of said chain of delay elements is captured in response to the calibration pulse, and, previous or subsequent, a second actual status of said chain of delay elements is captured in response to a signal related to said time to be converted. A ratio is formed using the first and second actual status, e.g. by norming the second actual status using the first actual status as a norming factor, and such ratio is taken into account when converting said time to said digital value. In an embodiment the first and second actual status can be stored and/or converted into a numerical value which is stored, and subsequently a quotient "second value first value" can be calculated and taken into account when converting said time to said digital value.

In an embodiment, a first status of the chain of delay elements is expected in response to said calibration pulse and an actual status in response to said calibration pulse is captured or measured and compared with the expected first status. Any deviation of the actual status in response to said calibration pulse compared to the expected status is calculated and stored. During the conversion of a time to be converted the stored deviation values are taken into account resulting in a very accurate time-to-digital conversion.

In an embodiment the same delay elements are used for calibration and conversion. In an embodiment the calibration pulse is injected timely close to the time interval to be converted, e.g. immediately preceding or subsequent to a pulse representing said time interval to be converted.

In an embodiment the chain of delay elements is built-up in a closed loop, thus establishing a closed ring that can be excited for oscillation forming a ring oscillator. In an alternative embodiment the delay elements are arranged in series having a first and a last delay element. In an embodiment at least two chains of delay elements being arranged in cascaded groups, e.g. the converter comprises a Vernier delay line comprising two open (no closed loop) chains of delay elements.

Embodiments can realize e.g. time-to-digital conversion for time stamping applications or time interval measurements. Alternative embodiments can be applied for jitter measurements in digital systems, dynamic phase-locked-loop (PLL) measurements, demodulation of phase modulated or frequency modulated carrier with high linearity and/or analog-to-digital conversion with high linearity. High resolution time-to-digital converter have application in a number of measurement systems, e.g. time-of-flight particle detectors, laser range-finders and logic analyzers. Modern time-of-flight spectrometry systems, used in particle physics experiments as well as in industrial methods of material surface analysis necessitate a time-to-digital converter to have a resolution well below 1 ns, low dead-time, and a large dynamic range.

The operation of the Vernier delay line is based on the delay line method, where the time resolution is determined by a logic buffer delay. The delay of a buffer in a first delay chain is greater than a delay of a buffer in the second delay chain. As the START and STOP pulses propagate in their respective delay chains, the time difference between them decreases with propagation of the pulses through the delay lines. At the output of each delay element the signal of the first and second delay chains are fed into an arbiter circuit, e.g. a D-type latch can perform this function, detecting which of the pulses came first. The position in the delay line, at which the STOP signal catches-up with the START signal gives information about the time to be measured between START and STOP in digital form with the resolution equal to the difference in buffer delay.

The first delay element of the first chain and the first delay element of the second chain form a first group and both first delay elements are connected to a first shift register formed e.g. by two D flip-flops wherein the output of the first D flip-flop is coupled to the input of the second D flip-flop. The outputs of the first and second D flip-flops are available externally of the Vernier delay line for further processing. In the same manner second delay elements of the first and second delay chains are coupled to a second shift register etc.

The digital outputs of the shift registers represent a measure for the time to be converted. The coarse time can be converted by counting a number of reference clock cycles related to the time to be converted, thus providing long term accuracy. The fine time can be converted by detecting the pulse position in a Vernier delay line resulting in sub gate delay resolution. In an embodiment the parallel capture of Vernier delay line status results in a high sample rate. In an embodiment linearity calibration based on histogram of pulse positions and the use of a ring oscillator as statistically independent trigger source provides very good linearity. In an embodiment the correction of absolute fine time by injecting two reference clock edges into the Vernier delay line after every measured pulse position provides very good linearity at boundaries between fine and coarse time. In an embodiment the read-out during calibration and conversion phase through the same logic avoids any negative effects due to any drifts, e.g. temperature or voltage drift.

In an embodiment the shift registers having a depth or number of stages corresponding to the number of measuring pulses plus the number of calibration pulses. In an embodiment with one measuring pulse and one calibration pulse the shift registers have two stages and correspondingly two output signals for each shift register. The two outputs of each shift register are formed by the outputs of two D flip-flops. In an embodiment all first outputs of all shift registers represent a measure for the time of the calibration pulse, whereas all second outputs of all shift registers represent a measure for the time to be converted.

The invention relates also to a method for time-to-digital conversion comprising the step of injecting a calibration pulse of known position and/or known duration in time into at least one chain of delay elements and taken into account a deviation between an expected first status and an actual second status of said chain of delay elements in response to a calibration pulse when converting the time interval to said digital signal.

Embodiments of the invention can be partly or entirely embodied or supported by one or more suitable software programs, which can be stored on or otherwise provided by any kind of data carrier, and which might be executed in or by any suitable data processing unit. Software programs or routines can be advantageously applied during calibration phase and/or during conversion phase, in particular during the step of relating the pulse position to a digital time value, during correction of the related digital time value according to a correction table, for the decision which coarse counter is to be chosen and/or during combination of the outputs of coarse and fine time counter units.

BRIEF DESCRIPTION OF THE DRAWINGS

Other objects and many of the attendant advantages of embodiments of the present invention will be readily appreciated and become better understood by reference to the following more detailed description of embodiments in connection with the accompanied drawing(s). Features that are substantially or functionally equal or similar will be referred to by the same reference sign(s).

Embodiments of the present invention will be detailed subsequently referring to the appended drawings, in which:

FIG. 4 shows the calculation of correction values to be stored in the correction table, FIG. 5 shows the calibration of the total ring delay.

DETAILED DESCRIPTION OF THE INVENTION

Figure 1:
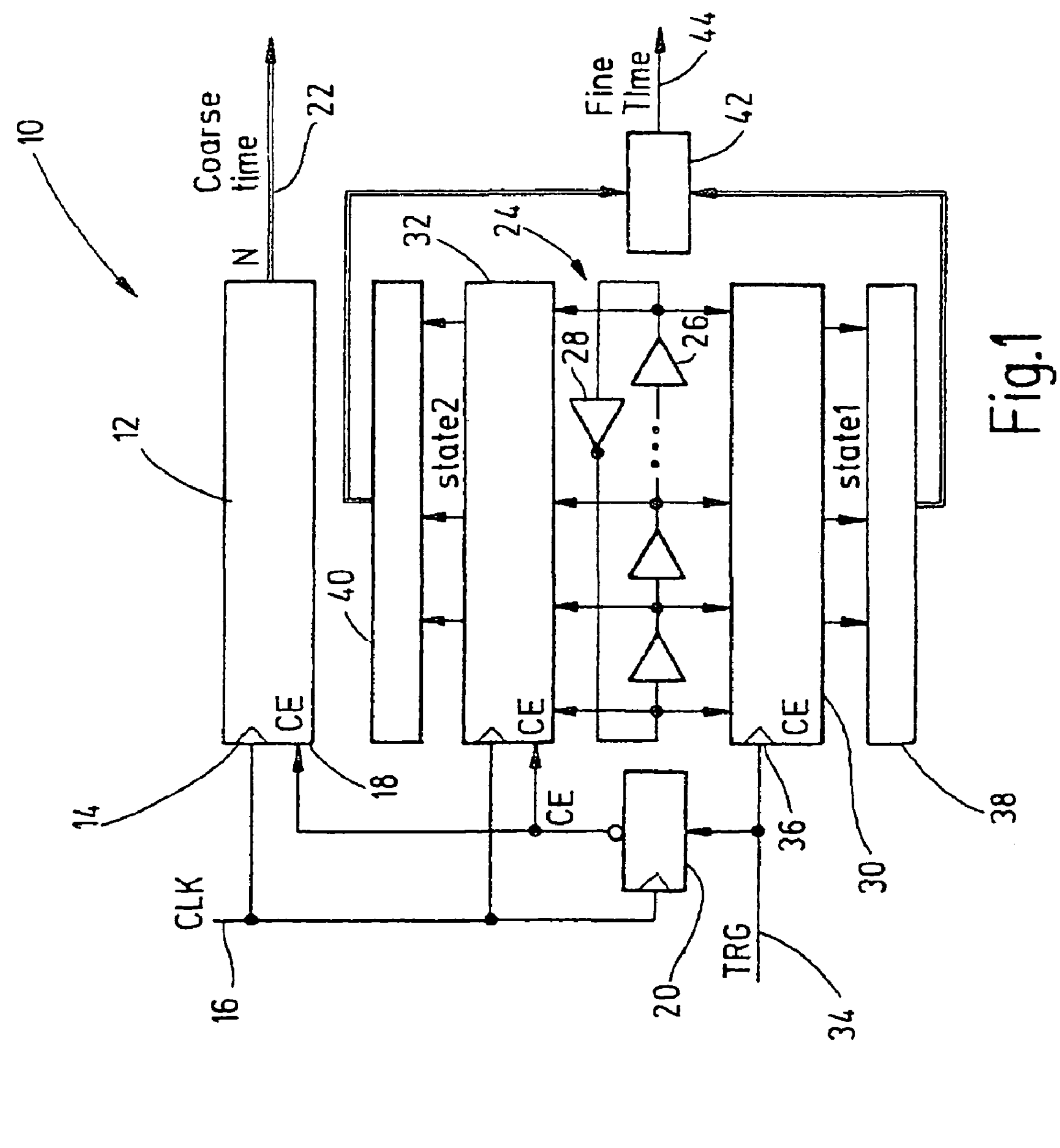
FIG. 1 shows a time-to-digital converter comprising a ring oscillator.

FIG. 1 shows a time-to-digital converter 10 comprising a ring oscillator 24. The time-to-digital conversion is a combination of coarse time conversion and fine time conversion. A coarse time is determined by a coarse time converter unit 12 having a first input 14 connected to a stable reference clock 16 and a second input 18 connected to the output of a D flip-flop 20. The second input 18 represents the COUNT ENABLE (CE) or reset of the coarse counter 12. A count value C is output at the output 22 representing the coarse time to be converted.

A pulse is circulated in the ring oscillator 24 comprising a plurality of delay elements 26 and an odd number of inverters 28. The output of each delay element 26 and of said inverter 28 is connected to a first fine time register 30 as well as to a second fine time register 32. The state of the ring oscillator 24 is captured in the first fine time register 30 in response to a rising edge of a trigger signal 34 which is connected to the input 36 of the first fine time register 30 as well as to the input of D flip-flop 20. A first pulse position logic unit 38 determines the pulse position within the ring oscillator 24 at the time of the rising edge of trigger signal 34.

With the following rising edge of clock 16 the state of the ring oscillator 24 is captured in the second fine time register 32. A second pulse position logic 40 is connected with the second fine time register 32 and determines the pulse position within the ring oscillator 24 at the time of the following rising edge of clock signal 16. The outputs of first and second pulse position logic units 38, 40 are connected with a delta time calculation unit 42, the output 44 of which represents the fine time.

Figure 2:
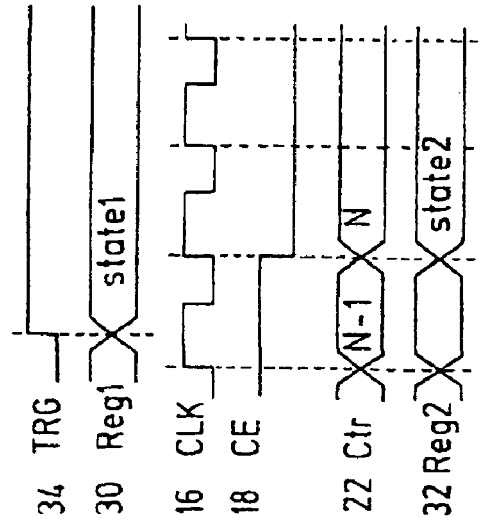
FIG. 2 shows a pulse diagram corresponding to the time-to-digital converter of FIG. 1.

FIG. 2 shows a pulse diagram corresponding to the time-to-digital converter 10 of FIG. 1. The upper line shows the rising edge of the trigger signal 34. Correspondingly the first register 30 changes its state into "state 1". The third line shows the clock 16 being a stable reference signal. The COUNT ENABLE (CE) signal at the second input 18 of coarse time converter unit 12 is shown in the fourth line, derived from the clock 16 and provided by the output of the D flip-flop 20. If CE=0, then the coarse time converter unit 12 stops counting and keeps the last state C at its output 22. The last line represents "state 2" of the second register 32.

In practice, mismatches of the many individual buffer delay elements 26 cause a non-linearity of the fine time measurement. The combination of fine time and coarse time conversion can even result in non-monotonicity, in particular at boundaries of the coarse counts, because coarse and fine conversion are based on different frequencies, i.e. the coarse time conversion is based on the clock frequency and the fine time conversion is based on the frequency of the ring oscillator 24. In addition, within the fine time conversion different paths are used for capturing the state of the ring oscillator 24 in response to the trigger signal 34 and the clock signal 16. Using different paths can introduce different mismatches. Furthermore, the large pulse position logic units 38, 40 are needed twice.

Another time-to-digital conversion comprises injection of a trigger signal into a buffer delay chain for fine time measurement. The pulse position is captured with the next clock edge. The clock is also counted as a measure of the coarse time. Mismatches of the individual buffer delay elements cause a non-linearity of the fine time measurement. Furthermore the non-continuos operation of the delay chain causes thermal changes and corresponding delay drift.

Another time-to-digital conversion comprises starting of an analog ramp by a trigger. The next clock edge stops the ramp and the reached ramp level is used as a measure for the fine time. The clock is also counted as a measure for the coarse time, wherein the trigger captures the state of the corresponding coarse time counter. The linearity of the analog ramp signal limits the linearity of the fine time conversion.

Figure 3:
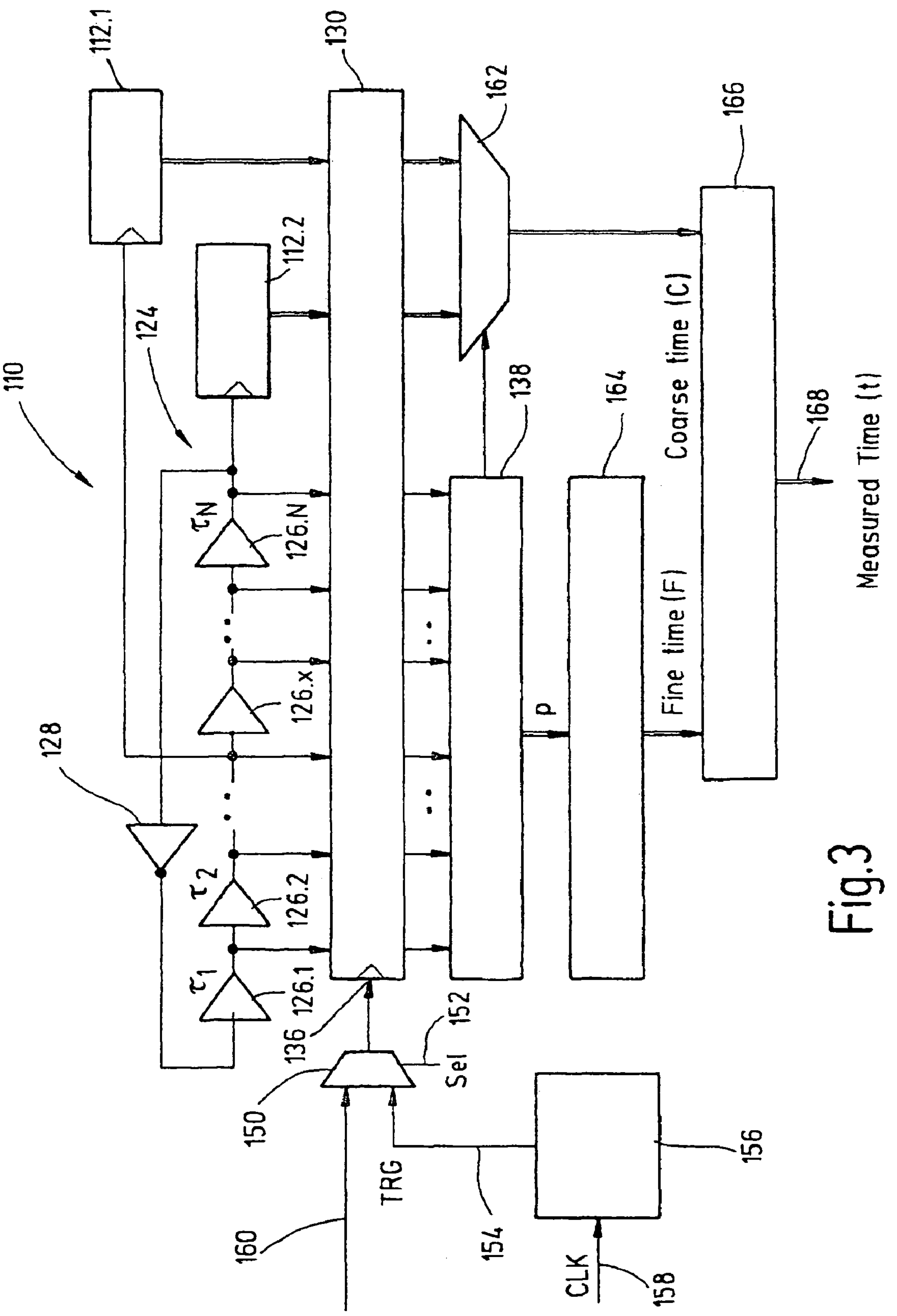
FIG. 3 shows an embodiment of the present invention.

FIG. 3 shows an embodiment of the present invention. The time-to-digital converter 110 comprises a ring oscillator 124 having an inverter 128 and n delay elements 126.1, 126.2, . . . , 126.*x*, . . . 126.N each of which having an individual delay time $\tau_1, \tau_2, \ldots \tau_N$. The input of the middle delay element 126.X is connected to the input of a first coarse time counter 112.1, and the output of the last delay element 126.N is connected to the input of a second coarse time counter 112.2. The outputs of all delay elements 126.1, 126.2, . . . , 126.*x*, . . . 126.N are individually connected to corresponding inputs of a register 130. The outputs of the first and second coarse time counter 112.1, 112.2 are connected to corresponding inputs of the register 130.

The input 136 of the register 130 is connected to the output of a first switch or selection unit 150 for selecting or switching between a conversion mode and a calibration mode of the converter 110 according to a selection signal on input 152. The input 136 may be a clock entry of the register 130. In the calibration mode trigger signals 154 having statistically equally distributed variable positions relative to the pulse forwarded in ring oscillator 124 are switched to the input 136 of the register 130. The trigger signals 154 are provided by a trigger signal source 156 on the basis of a trigger source clock 158. In the conversion mode the time signal 160 comprising the edge defining the time to be converted is switched to the input 136 of the register 130.

Coarse time is measured by counting the ring oscillator cycles or periods. Contrary to the converter 10 in FIG. 1 no reference clock is counted for coarse time measurement. A rising and/or falling edge in the time signal 160 triggers the register 130 to capture the complete status of the ring oscillator 124 as well as the status of first and second coarse time counter 112.1, 112.2. The captured pulse position within the ring oscillator 124 is a measure for the fine time measurement of the position of the corresponding edge in the time signal 160.

The register 130 provides output signals corresponding to the status of the delay elements 126.1, 126.2, 126.N to a pulse position logic 138. Furthermore the register 130 provides output signals corresponding to the status of the first and second coarse time counter 112.1, 112.2 to a second switch 162, which is controlled by the pulse position logic unit 138. If the pulse position logic unit 138 detects that the pulse is close to the end of the ring oscillator, e.g. near or at the position of the last delay element 126.N, then the captured status of first coarse counter 112.1 is used for coarse time measurement, otherwise the captured status of second coarse counter 112.2 is used for coarse time measurement. This avoids inconsistent transitioning coarse counter status. The fine time is measured using the captured status of the ring oscillator 124 and fine and coarse time measurements are combined. Using the ring oscillator 124 for fine as well as for coarse time measurement overcomes the need to count a clock and ensures monotonicity. The pulse position logic unit 138 and the following logic can be realized in hardware or software, or in a combination of hard- and software.

The embodiment in FIG. 3 further comprises a method and the structure for calibration of the ring oscillator 124. The basic idea is to randomly capture the status of the ring oscillator 124, e.g. the status of all delay elements 126.1, 126.2, 126.N of the ring oscillator 124. The occurring pulse positions are dependent on the individual delay of the delay elements 126.1, 126.2, 126.N, e.g. it is possible to determine the individual delay of each delay elements 126.1, 126.2, 126.N on the basis of the pattern, e.g. of a histogram, of the distribution of pulse positions.

In the calibration mode the first switch unit 152 switches trigger signals 154 to the input 136 of register 130. The pulse positions are determined for each of a large number of e.g. M trigger signals 154. A histogram is created and corrections values for each pulse position is calculated and stored in a fine time correction table 164.

In the conversion mode the time signal 160 comprising the edge defining the time to be converted is switched to the input 136 of the register 130. The pulse position within the ring oscillator 124 is captured and forwarded to the pulse position logic unit 138 which look-up in the fine time correction table

164 for fine time correction resulting in exact fine time measurement. Fine time value F and coarse time value C are combined by combination unit 166 at the output of which the converted time as a digital signal 168 is provided. This method allows for non-invasive calibration, i.e. the ring oscillator 124 is neither interrupted for calibration nor anything else is changed in the structure of the converter 110. No relevant hardware overhead may be needed for the calibration, in particular no time reference. The trigger signal 154 can be random or deterministic or even periodic, e.g. a stable clock.

FIG. 4 shows the calculation of correction values to be stored in the correction table 164, wherein N is the number of stages in the ring oscillator 124, M is the number of trigger signals 154 during calibration, wherein M>>N, $p_m$ is the pulse position for each of M triggers, $h_n$ represents the histogram, e.g. the occurrences of pulse position $p_m$ is equal to n, and $F_k$ represents the content of the correction table 164, e.g. corrected fine time values for pulse position k, normalized to complete ring delay being equal to 1.

FIG. 5 shows the calibration of the total ring delay. The first switch unit 152 selects trigger signal 154 as input for the register 130. Two trigger events are generated at times $T_1$ and $T_2$, separated by exactly L periods of a stable and known clock 158. The values $C_1$ and $C_2$ of the first and second coarse time converter units 112.1, 112.2 are recorded as well as pulse positions $p_1$ and $p_2$. As a variation the first and last trigger of calibration can be used. Fine delay calibration can be ignored, F(p)=p/N, using L being large enough. Fine time measurement can be ignored, $t=t_R\times C$, using L being large enough.

The conversion is monotonous at ring cycle boundaries and only one single path to capture the status of the ring oscillator 124 simplifies calibration. The frequency drift can be reduced due to the free-running ring oscillator 124. The remaining frequency drift of the ring oscillator 124 can easily be corrected. The calibration is accurate because the operation of the ring oscillator 124 is not changed between calibration mode and conversion mode.

The embodiment described above provide perfect boundary between coarse and fine delay and the monotonicity given e.g. by the ring oscillator or a single delay chain enables histogram calibration resulting in a very linear conversion. If in an embodiment the ring oscillator is free running, its frequency is not fixed and thus the absolute time cannot be measured directly. In a further embodiment at least one open (no closed loop) chain of delay elements is used at least for fine time conversion.

Figure 6:
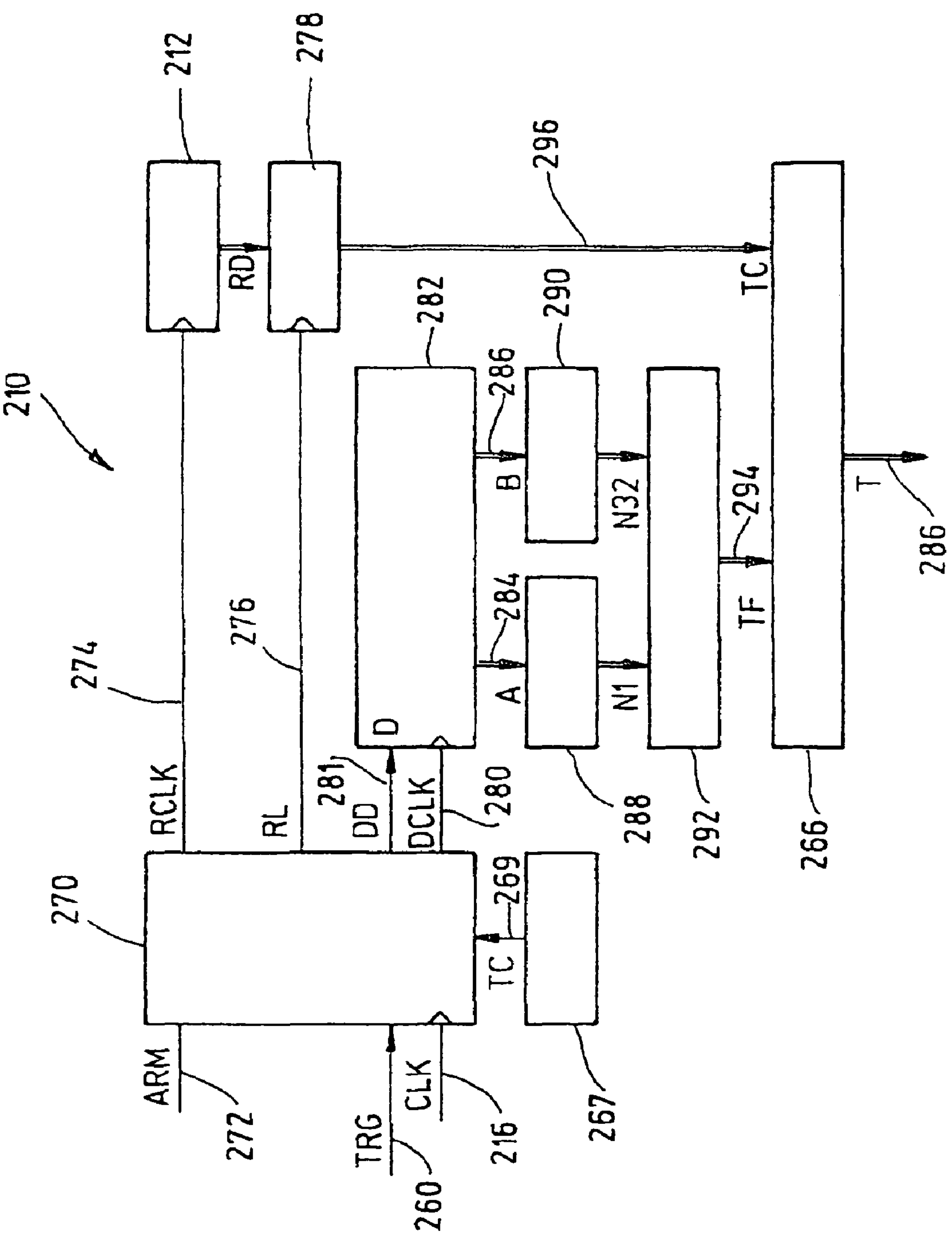
FIG. 6 shows a further embodiment of a time-to-digital converter.

FIG. 6 shows a further embodiment of a time-to-digital converter 210. A control unit 270 starts the conversion in response to an arming ARM signal 272. The control unit 270 outputs a reference or register RCLK clock 274 to a coarse counter 212 operated for example with a frequency of 2 GHz. Due to a register load RL signal 276 outputted by the control unit 270 to a coarse register 278 the status of the coarse counter 212 is captured by the coarse register 278. The reference RCLK clock 274 corresponds to the clock CLK signal 216 provided to the control unit 270. Until a rising edge of a trigger TRG signal 260 representing the time signal to be converted the coarse counter 212 counts by one at every rising edge of the reference clock RCLK signal 274.

The control unit 270 forwards the clock CLK signal 216 as delay line DCLK clock 280 injecting each pulse of the delay line DCLK clock 280 in a second chain of delay elements of Vernier delay line unit 282. The delay elements of that second chain having in general a larger delay time than the delay elements of a first chain of the Vernier delay line unit 282, i.e. $T_1>\tau_1$ (see FIG. 7). A pulse DD signal 281 is injected in the first chain comprising a measuring edge in response to the trigger signal 260 forwarded by the control unit 270. Following said measuring edge the DD signal 281 comprises at least one further edge, advantageously at least two further edges, defining a calibration pulse of defined length. In an embodiment the calibration pulse follows said measuring edge as soon as possible to have the same thermal and other conditions for the measuring edge and for the calibration pulse. In an embodiment the time between the measuring edge and the calibration pulse is between one and two clocks. In an embodiment the Vernier delay line unit 282 comprises about 700 stages or groups of delay elements with a difference of 1 ps.

For each stage or group of delay elements of the first and second delay line the Vernier delay line unit 282 comprises a shift register comprising two D flip-flops, e.g. a first and second D flip-flop. All outputs of the first D flip-flops of all stages of the Vernier delay line unit 282 representing a second B output 286 of the Vernier delay line unit 282. Correspondingly all outputs of all second D flip-flops forming a first A output 284 of the Vernier delay line unit 282.

The first output 284 is connected to a pulse position unit 288 and the second output 286 is connected to a period stages unit 290. The outputs of the pulse position unit 288 and the period stages unit 290 are connected to a correction unit 292 taking into account any deviation between a first status of the chain of delay elements being expected in response to a calibration pulse and an actual status of said chain of delay elements in response to said calibration pulse when determining the fine time. The output 294 of the correction unit 292 representing fine time TF measurement as well as the output 296 of a coarse register 278 representing coarse time TC are connected to a combination unit 266. The output 268 of the combination unit 266 provides the time T to be converted as a digital signal.

As an alternative or in addition to the absolute time or period calibration described above for the embodiment with the Vernier delay line unit 282 a histogram calibration can be applied similar or identical as described above for the embodiment with the ring oscillator 124 (see FIG. 3). A calibration trigger unit 267 provides trigger TC signals 269 to the control unit 270 such that the pulse positions in time have equal probability.

Figure 7:
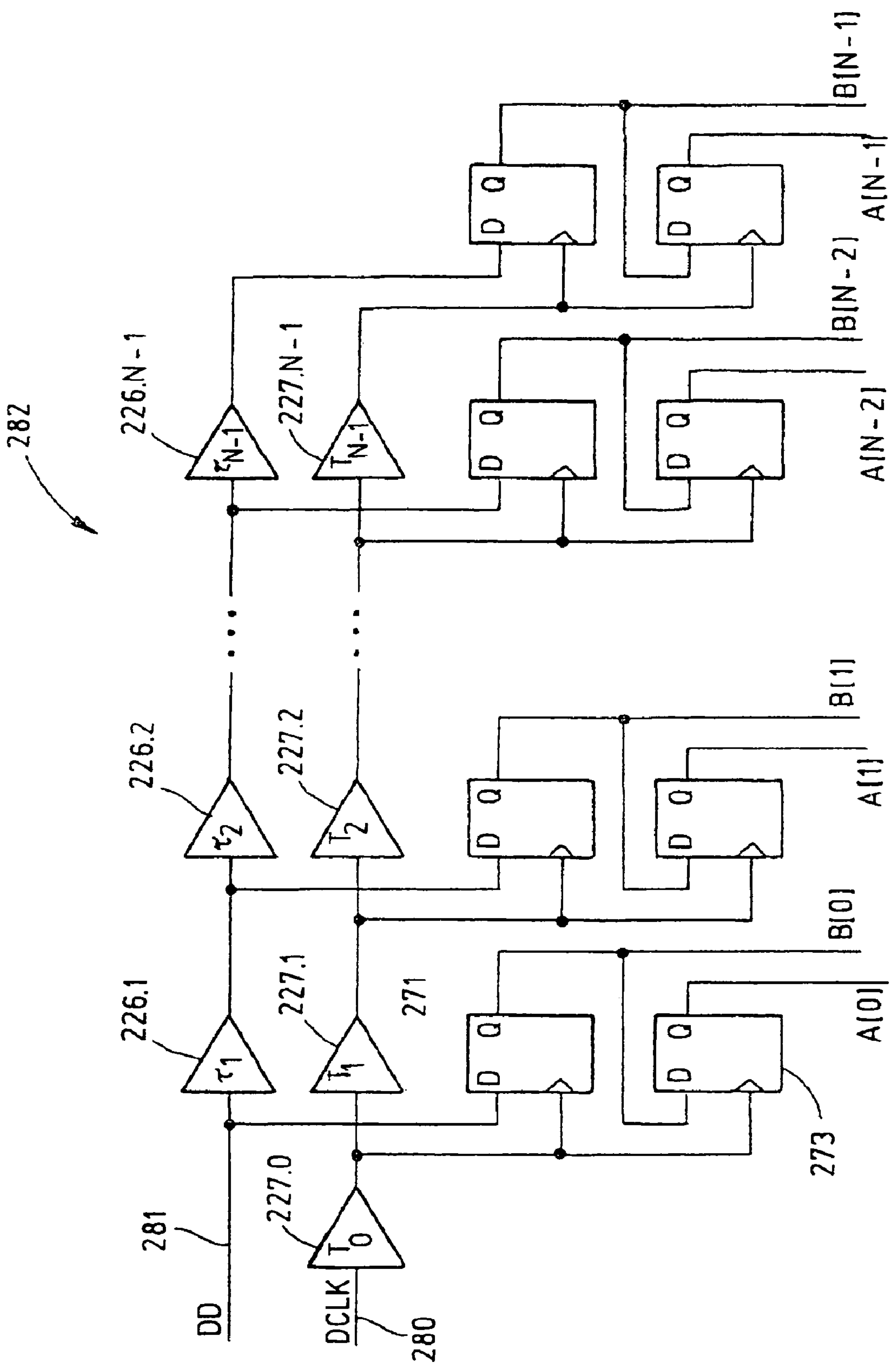
FIG. 7 shows one possible embodiment of the Vernier delay line unit shown in FIG. 6.

FIG. 7 shows one possible embodiment of the Vernier delay line unit 282 shown in FIG. 6. A first delay line comprising N−1 delay elements 226.1, 226.2, . . . 226.N−1 having a smaller delay time $\tau_1, \tau_2, \ldots \tau_{N-1}$ than a second delay line comprising N delay elements 227.0, 227.1, 227.2, . . . 227.N−1 having delay time $T_1, T_2, \ldots T_{N-1}$. The delay line clock DCLK signal 280 is connected to a leading delay element 227.0 of the second delay line which—in the shown embodiment only—has no counterpart in the first delay line. Each subsequent delay element 227.1, 227.2, . . . 227.N−1 of the second delay line has a counterpart in the first delay line thus forming N−1 groups of delay elements 226.1, 227.1-226.2, 227.2- . . . -226.N−1, 227.N−1. To each group of delay elements a shift register is related comprising a first D flip-flop 271 and a second D flip-flop 273. Since all groups or stages of the Vernier delay line unit 282 are identical, in the following only the first group or stage formed by delay elements 226.1, 227.1 is described.

The pulse DD signal 281 for the first delay line is connected to the first delay element 226.1 as well as to the D input of first D flip-flop 271. The delay line DCLK clock 280 is connected to the leading delay element 227.0, the output of which is connected to the first delay element 227.1 of the second delay line as well as to the clock input of first and second D flip-flops 271, 273. The output of the first D flip-flop 271 is provided as a first bit B[0] of the second output 286 of Vernier delay line unit 282 as well as connected to the D input of second D flip-flop 273. The output of the second D flip-flop 273 is provided as the first bit A[0] of the first output 284 of Vernier delay line unit 282. In an embodiment the number of groups of pairs of delay elements 226.1, 227.1 and shift registers 271, 273 is 700 resulting in 700 bits A[0], . . . , A[699] of the first output 284 and 700 bits B[0], . . . , B[699] of the second output 286.

Figure 8:
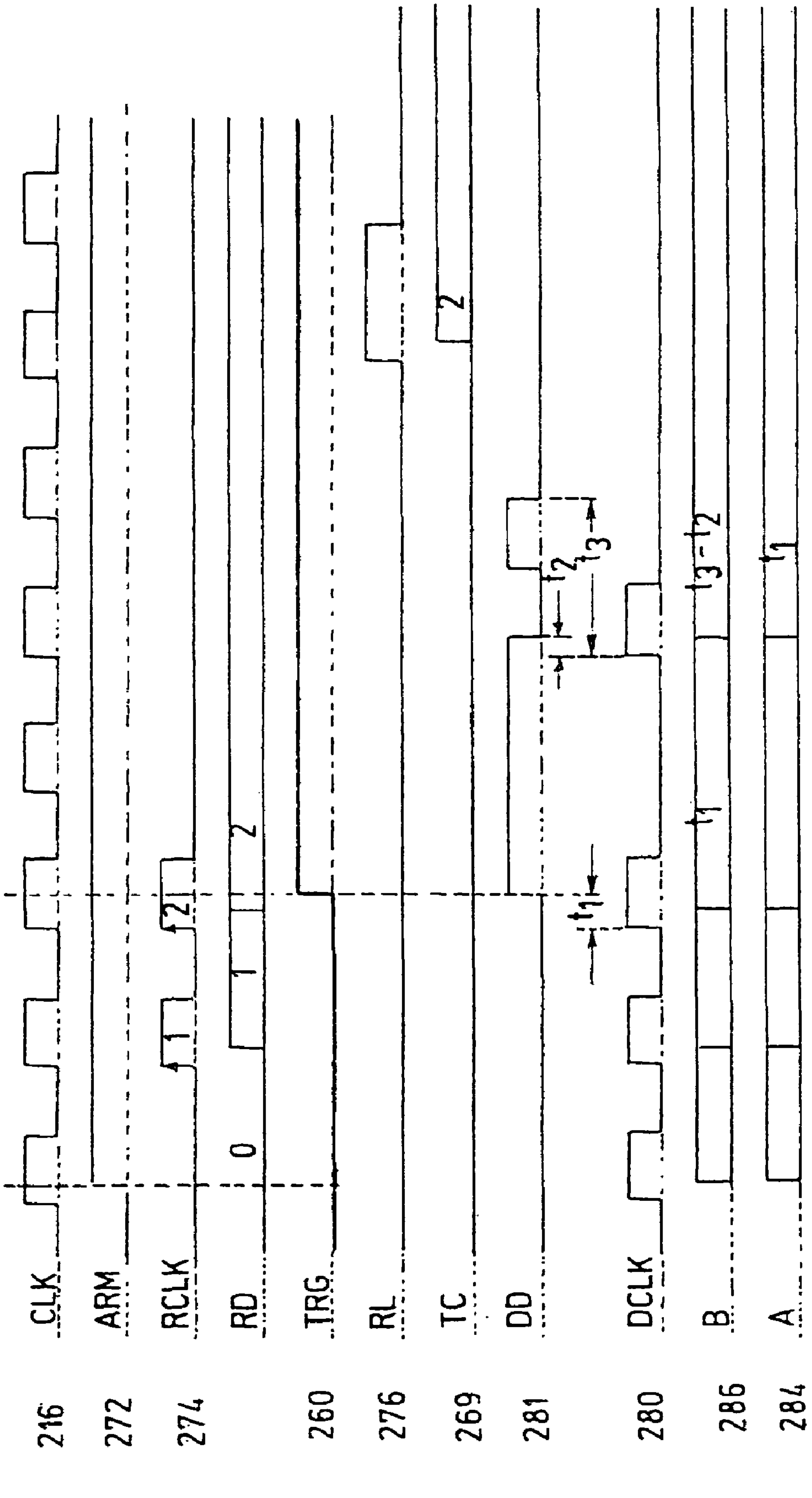
FIG. 8 shows a timing diagram for an embodiment of the converter of FIG. 6.

FIG. 8 shows a timing diagram for an embodiment of the converter 210 of FIG. 6. In the upper line the clock CLK signal 216 is shown which can be a stable reference clock. The arming ARM signal 272 enables the conversion. The delay line DCLK clock 280 may simply correspond to the clock signal 216. The coarse counter 212 counts every rising edge of the reference RCLK clock 274 until a rising edge of the trigger TRG signal 260 occurs. The counted number, e.g. "2", is loaded as RD signal from the coarse counter 212 into the register 278 and can be provided to the combination unit 266 as coarse time signal 296.

In an embodiment the time to be converted into a digital signal is the time difference $t_1$ between the rising edge of the trigger TRG signal 260 and a preceding rising edge of the delay line clock DCLK signal 280. The time to be converted can also be a time interval defined by $t_1$ or comprising $t_1$. The corresponding information is first available at a second B output 286 of Vernier delay line unit 282. The rising edge of the trigger TRG signal 260 is adopted by pulse DD signal 281. Following the rising edge of pulse DD signal 281 injected into the first delay line of Vernier delay line unit 282 after a predetermined time a calibration pulse of known position and/or known duration $t_3$-$t_2$ in time is injected in said chain of delay elements. A particular status of the chain of delay elements is expected in response to said calibration pulse. The actual status of said chain of delay elements in response to said calibration pulse is captured due to a pulse of delay clock 280 and provided at the second B output 286 of the Vernier delay line unit 282 and simultaneously the previous value of the second B output 286 corresponding to the time $t_1$ to be converted is shifted into the first A output 284 of the Vernier delay line unit 282.

Due to variations in the individual delay time $\tau_1, \tau_2, \ldots$ and $T_1, T_2, \ldots$ of the delay elements in the first and second delay chain, i.e. deviations of the actual delay times and the nominal delay times of the according individual delay elements, differences between the delays of the first and second delay lines can change sign and thus accumulated delay may be non-monotonous. Since histogram calibration necessitates monotonicity, the output of the Vernier delay line unit 282 has to be processed to ensure monotonicity.

The pulse position unit 288 provides monotonicity by applying a rule, e.g. to indicate the position of first "1" or of last "0" in the first A output 284 of the Vernier delay line unit 282. For example the Vernier delay line unit 282 provides 700 bits for the first A output 284, i.e. as thermometer coded "000 . . . 01011111". The rule implemented in the pulse position unit 288 is, for example, to indicate the position of the last "0". In the above given example, the last "0" is on the $6^{th}$ position counted from behind. For the $700<2^{10}$ bits of the first A output 284 the number N1 at the output of the pulse position unit 288 is of 10 bit width. Accordingly the $6^{th}$ position of the last "0" is indicated as "0000000110" in binary code at the output of pulse position unit 288. Applying such a rule makes the output N1 of pulse position unit 288 monotonous.

Figure 9:
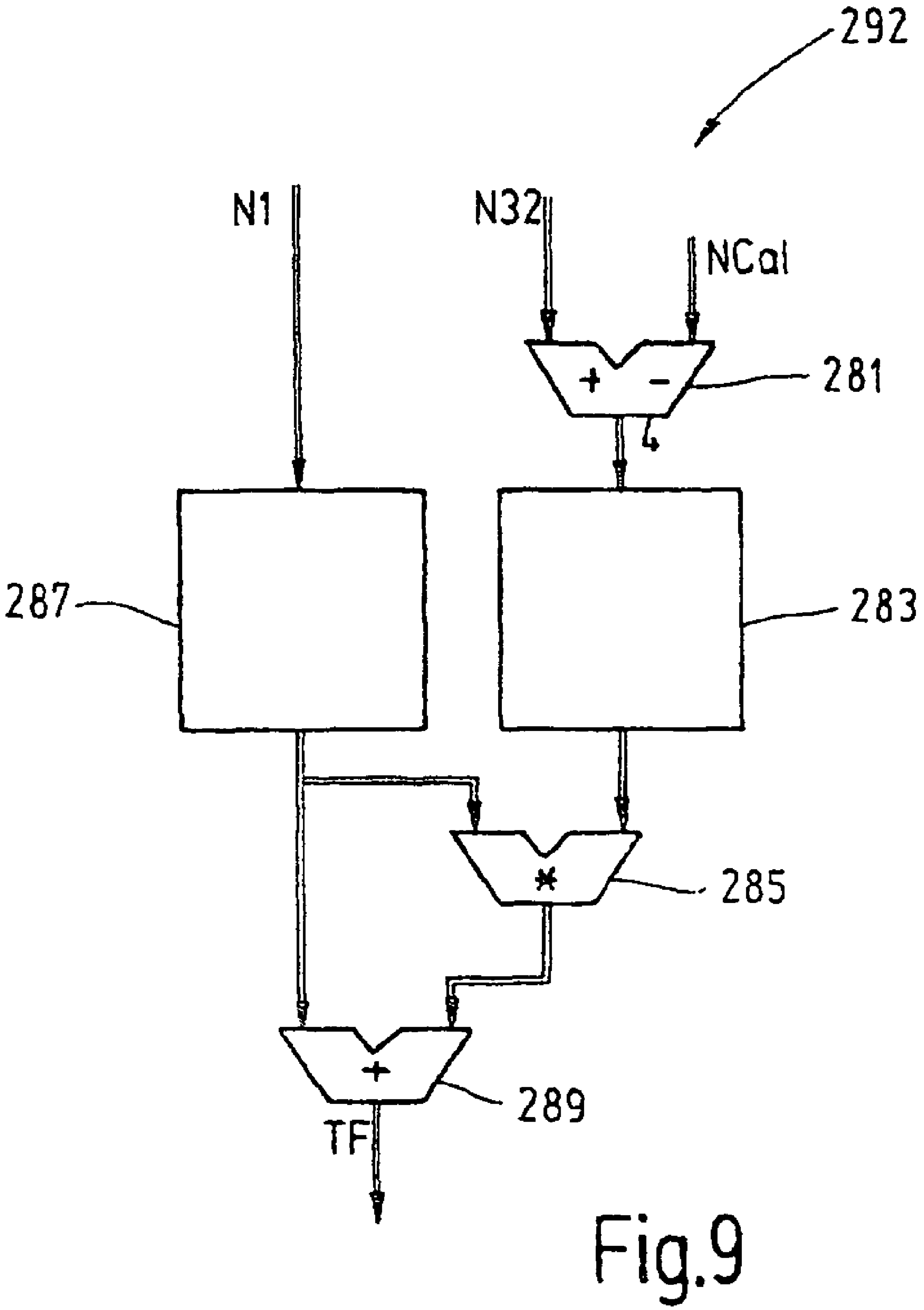
FIG. 9 shows an embodiment for the correction unit of the converter shown in FIG. 6.

FIG. 9 shows an embodiment for the correction unit 292 of the converter 210 shown in FIG. 6. The period stages unit 290 provides a signal N32 representing the actual measurement of the calibration pulse, e.g. a measurement for the time $t_3$-$t_2$ (see FIG. 8), derived from the second B output 286 of the Vernier delay line unit 282. A switch and/or difference forming unit 281 forwards the signal N32 or a difference of the signal N32 and a calibration signal Ncal to a period correction table 283. In an embodiment the switch and/or difference forming unit 281 calculates the deviation or difference of a first status of said chain of delay elements being expected in response to said calibration pulse and an actual status of said chain of delay elements in response to said calibration pulse. The result may be forwarded as a 4 bit word to the period correction table 283.

In an embodiment the period correction table 283 assigns a correction value depending on the deviation or difference of expected and actual status in response to the calibration pulse. The correction value may be dependent on the expected and/or actual length of the calibration pulse. The correction value may be forwarded as a 6 bit word to a weighting unit 285.

The output N1 of the pulse position unit 288, being for example a 10 bit word, is connected to a stage correction table 287, determining a rough correction value, being for example a 10 bit word, depending on the output N1 of the pulse position unit 288. The rough correction value represents a first correction value and is connected to the weighing unit 285 as well as to a adder unit 289. The weighting unit 285 outputs a second correction value to the adder unit 289, e.g. by weighting the first correction value depending on the correction value assigned by the period correction table 283, e.g. by calculating a second correction value as the result of a multiplication of the first correction value with the correction value assigned by the period correction table 283. At the output of the adder unit 289 the corrected fine time TF is provided for the combination unit 266.

In an embodiment look-up tables are stored in period correction table 283 and/or stage correction table 287. The period correction table 283 may represent the correction resulting from absolute period calibration using the calibration pulse of length $t_3$-$t_2$ as described above. The stage correction table 287 may represent the correction resulting from histogram calibration. Thus the content of the stage correction table 287 can be calculated correspondingly as described for FIG. 4. For randomly capturing the state of the Vernier delay line unit 282 a suitable calibration trigger signal source 267 is used, e.g. a ring oscillator being statistically uncorrelated to the coarse frequency, i.e. to the pulse position. Other clock sources might be used as well. In an embodiment a high accuracy low-jitter clock may not be needed, instead the clock may comprises jitter since any jitter improves randomness. The pulse position $p_m$ for each of M trigger signals is determined and a histogram is created and a fine time correction table is calculated due to the fact, that the pulse position occurrence is proportional to stage delay. During conversion, the pulse position p is determined and a correction value is selected from the look-up table. This provides non-invasive calibration, without interrupting the normal operation, and only few or no additional hardware is needed and/or no time reference, but only a stable frequency.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A time-to-digital converter comprising at least one chain of delay elements, wherein a status of the chain of delay elements represents a digital signal relating to a time interval to be converted, comprising:

an injector for injecting a calibration pulse of known position and/or known duration in time into the chain of delay elements;

a capturer for capturing a first actual status of the chain of delay elements in response to the calibration pulse and a second actual status of the chain of delay elements in response to a signal related to the time interval to be converted;

a former for forming a ratio of the first and second actual status; and a correction unit for taking into account the ratio when converting the time interval to the digital signal.

2. The time-to-digital converter of claim 1, wherein a pulse representing the time interval to be converted is injected into the same chain of delay elements as the calibration pulse.

3. The time-to-digital converter of claim 1, wherein the calibration pulse is injected subsequent and/or preceding to a pulse representing the time interval to be converted.

4. The time-to-digital converter of claim 1, wherein the calibration pulse is injected immediately subsequent and/or preceding to a pulse representing the time interval to be converted.

5. The time-to-digital converter of claim 1, wherein the calibration pulse is injected subsequent and/or preceding to each pulse representing the time interval to be converted.

6. The time-to-digital converter of claim 1, wherein the calibration pulse is injected between two pulses representing the time interval to be converted.

7. The time-to-digital converter of claim 1, wherein the time-to-digital converter comprises at least two chains of delay elements, wherein the status of the at least two chains of delay elements is captured by a number of shift registers, each of the shift registers being connected to at least one delay element of the first chain and at least one corresponding delay element of the second chain.

8. The time-to-digital converter of claim 7, wherein a data input of each shift register is connected to the corresponding delay element of the first chain and a clock input of each shift register is connected to the corresponding delay element of the second chain.

9. The time-to-digital converter of claim 7, wherein the number of the shift registers corresponds to the number of delay elements within one of the at least two delay chains.

10. The time-to-digital converter of claim 7, wherein the shift registers have a depth corresponding to the number of measuring pulses plus the number of calibration pulses.

11. The time-to-digital converter of claim 7, wherein in a first stage of the shift registers the actual status of the chain of delay elements in response to the calibration pulse is stored, and in a second stage of the shift register a status of the chain of delay elements in response to a pulse representing the time interval to be converted is stored.

12. A time-to-digital converter comprising at least one chain of delay elements, wherein a status of the chain of delay elements represents a digital signal relating to a time interval to be converted, wherein the time-to-digital converter comprises:

an injector for injecting a calibration pulse of known position and/or known duration in time into the chain of delay elements;

a capturer for capturing an actual status of the chain of delay elements in response to the calibration pulse;

a calculator for calculating a deviation between a first status of the chain of delay elements and the actual status, the first status being expected in response to the calibration pulse; and a combination unit for taking into account the deviation when converting the time interval to the digital signal.

13. A method for time-to-digital conversion using a time-to-digital converter comprising at least one chain of delay elements, wherein a status of the chain of delay elements represents a digital signal relating to a time interval to be converted, wherein the method comprises the steps of:

injecting a calibration pulse of known position and/or known duration in time into the chain of delay elements;

capturing a first actual status of the chain of delay elements in response to the calibration pulse and a second actual status of the chain of delay elements in response to a signal related to the time interval to be converted;

forming a ratio of the first and second actual status; and taking into account the ratio when converting the time interval to the digital signal.

14. A method for time-to-digital conversion using a time-to-digital converter comprising at least one chain of delay elements, wherein a status of the chain of delay elements represents a digital signal relating to a time interval to be converted, wherein the method comprises the steps of:

injecting a calibration pulse of known position and/or known duration in time into the chain of delay elements;

capturing the actual status of the chain of delay elements in response to the calibration pulse;

calculating a deviation between a first status of the chain of delay elements and the actual status, the first status being expected in response to the calibration pulse; and taking into account the deviation when converting the time interval to the digital signal.

15. A software program or product, stored on a data carrier, for controlling or executing, when run on a data processing system such as a computer, a method for time-to-digital conversion using a time-to-digital converter comprising at least one chain of delay elements, wherein a status of the chain of delay elements represents a digital signal relating to a time interval to be converted, wherein the method comprises:

injecting a calibration pulse of known position and/or known duration in time into the chain of delay elements;

capturing a first actual status of the chain of delay elements in response to the calibration pulse and a second actual status of the chain of delay elements in response to a signal related to the time interval to be converted;

forming a ratio of the first and second actual status; and taking into account the ratio when converting the time interval to the digital signal.

16. A software program or product, stored on a data carrier, for controlling or executing, when run on a data processing system such as a computer, a method for time-to-digital conversion using a time-to-digital converter comprising at least one chain of delay elements, wherein a status of the chain of delay elements represents a digital signal relating to a time interval to be converted, wherein the method comprises:

injecting a calibration pulse of known position and/or known duration in time into the chain of delay elements;

capturing an actual status of the chain of delay elements in response to the calibration pulse;

calculating a deviation between a first status of the chain of delay elements and the actual status, the first status being expected in response to the calibration pulse; and taking into account the deviation when converting the time interval to the digital signal.

* * * * *